US006273965B1

(12) United States Patent
Pulvirenti et al.

(10) Patent No.: US 6,273,965 B1
(45) Date of Patent: Aug. 14, 2001

(54) MAGNETOSTRICTIVE MATERIALS AND METHOD FOR IMPROVING AC CHARACTERISTICS IN SAME

(75) Inventors: Patricia P. Pulvirenti, Chicago, IL (US); David C. Jiles, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 0 days.

(21) Appl. No.: 08/953,192

(22) Filed: Oct. 17, 1997

Related U.S. Application Data
(60) Provisional application No. 60/028,514, filed on Oct. 18, 1996.

(51) Int. Cl.$^7$ .................................................. H01F 1/04
(52) U.S. Cl. ...................................... 148/301; 420/416
(58) Field of Search .................................. 148/100, 301, 148/302; 420/416

(56) References Cited

U.S. PATENT DOCUMENTS

| | | | |
|---|---|---|---|
| 4,308,474 | * 12/1981 | Savage et al. | 310/26 |
| 4,375,372 | 3/1983 | Koon et al. | 75/123 E |
| 4,378,258 | 3/1983 | Clark et al. | 148/100 |
| 4,609,402 | 9/1986 | McMasters | 75/65 ZM |
| 4,770,704 | 9/1988 | Gibson et al. | 75/65 ZM |
| 5,110,376 | * 5/1992 | Kobayashi et al. | 148/301 |
| 5,336,337 | * 8/1994 | Funayama et al. | 148/301 |
| 5,693,154 | 12/1997 | Clark et al. | 148/301 |
| 5,907,269 | * 5/1999 | Zrostlik | 335/215 |
| 6,012,521 | 1/2000 | Zunkel et al. | 166/249 |
| 6,037,682 | 3/2000 | Shoop et al. | 310/26 |

FOREIGN PATENT DOCUMENTS

| | | |
|---|---|---|
| 405362 | 1/1991 | (EP) . |
| 419098 | 11/1994 | (EP) . |
| 361969 | 7/1996 | (EP) . |

OTHER PUBLICATIONS

Japanese Abstract No. JP363117355A, May 1988.*

Derwent Abstract No. 1998–440227, May 1998.*

Galloway, N., et al., "Enhanced Differential Magnetostrictive Response in Annealed Terfenol–D", *Applied Physics Letters*, vol. 63, 842–844, (Aug. 1993).

Jiles, D., et al., "Theoretical Modelling of the Effects of Anisotropy and Stress on the Magnetization and Magnetostriction of Tb0.3Dy0.7Fe2", *Journal of Magnetism and Magnetic Materials*, vol. 134, 143–160, Dec. 1994.

Peterson, D., et al., "Strength of Terfenol–D", *Journal of Applied Physics*, vol. 65, 3712–3713, (May 1989).

(List continued on next page.)

*Primary Examiner*—Scott Kastler
(74) *Attorney, Agent, or Firm*—Schwegman, Lundberg, Woessner & Kluth, P.A.

(57) ABSTRACT

The present invention provides Terfenol-D alloys ("doped" Terfenol) having optimized performances under the condition of time-dependent magnetic fields. In one embodiment, performance is optimized by lowering the conductivity of Terfenol, thereby improving the frequency response. This can be achieved through addition of Group III or IV elements, such as Si and Al. Addition of these types of elements provides scattering sites for conduction electrons, thereby increasing resistivity by 125% which leads to an average increase in penetration depth of 80% at 1 kHz and an increase in energy conversion efficiency of 55%. The permeability of doped Terfenol remains constant over a wider frequency range as compared with undoped Terfenol. These results demonstrate that adding impurities, such as Si and Al, are effective in improving the ac characteristics of Terfenol. A magnetoelastic Grüneisen parameter, $\gamma_{me}$, has also been derived from the thermodynamic equations of state, and provides another means by which to characterize the coupling efficiency in magnetostrictive materials on a more fundamental basis.

10 Claims, 14 Drawing Sheets

OTHER PUBLICATIONS

"Handbook of Mathematical Functions With Formulas, Graphs, and Mathematical Tables", *National Bureau of Standards Applied Mathematics Series—55*, Tenth Printing, Dec. 1972, with corrections, Edited by Milton Abramowitz and Irene A. Stegun, Table of Contents, (Jun. 1964).

Abbundi, R., et al., "Anomalous Thermal Expansion and Magnetostriction of Single Crystal $Tb_{.27}Dy_{.73}Fe_2$", *IEEE Transactions on Magnetics*, MAG–13, 1519–1520, (Sep. 1977).

Ashcroft, N.W., et al., "Solid State Physics", Table of Contents, Saunders College, Philadelphia, Dec. 1976.

Bertotti, G., "Physical Interpretation of Eddy Current Losses in Ferromagnetic Materials. I. Theoretical Considerations", *Journal of Applied Physics*, 57, 2110–2117, (Mar. 15, 1985).

Bertotti, G., "Physical Interpretation of Eddy Current Losses in Ferromagnetic Materials. II. Analysis of Experimental Results", *Journal of Applied Physics*, 57, 2118–2126 (Mar. 15, 1985).

Bozorth, R.M., "Ferromagnetism", D. Van Nostrand Company, Inc., New York, Chapter 17, 769–810, Dec. 1951.

Butler, J.L., et al., "Eddy Current Loss Factor Series for Magnetostrictive Rods", *J. Acoust. Soc. Am.*, 82, 378, (Jul. 1987).

Chin, G.Y., et al., "Soft Magnetic Metallic Materials", *Ferromagnetic Materials*, 2, E.P. Wohlfarth, Editor, North–Holland Publishing Company, A Handbook on the Properties of Magnetically Ordered Substances, 55–189, Dec. 1980.

Clark, A.E., "Magnetic and Magnetoelastic Properties of Highly Magnetostrictive Rare Earth–Iron Laves Phase Compounds", *AIP Conf. proc No. 18*, AIP New York, 1015–1029, Dec. 1974.

Clark, A.E., "Magnetostrictive Rare Earth–Fe2 Compounds", *Ferromagnetic Materials*, 1, Edited by E.P. Wohlfarth, Copyright North–Holland publishing Company, 1980, 531–589, Dec. 1980.

Clark, A.E., et al., "Giant Magnetically Induced Changes in the Elastic Moduli in $Tb_{.3}Dy_{.7}Fe_2$", *IEEE Transactions on Sonics and Ultrasonics*, SU–22, 50–52, (Jan. 1975).

Clark, A.E., et al., "Giant Room–Temperature Magnetostrictions in $TbFe_2$ and $DyFe_2$", *Physical Review B*, 5, 3642–3644, (May 1, 1972).

Clark, A.E., et al., "Magnetization and Magnetic Anisotropy of $TbFe_2$, $DyFe_2$, $Tb_{0.27}Dy_{0.73}Fe_2$ and $TmFe_2$", *IEEE Transaction on Magnetics*, MAG–14, 542–544, (Sep. 1978).

Clark, A.E., et al., "Magnetostriction in Twinned [112] Crystals of $Tb_{.27}Dy_{.73}Fe_2$", *IEEE Transactions on Magnetics*, MAG–22, 973–975, (Sep. 1986).

Clark, A.E., et al., "Magnetostriction of Rare Earth–$Fe_2$ Laves Phase Compounds", *Physica 86–88B*, 73–74, Dec. 1977.

Clark, A.E., et al., "Rhombohedral Distortion in Highly Magnetostrictive Laves Phase Compounds", *AIP Conf. Proc.*, No. 29, AIP, New York, 192–193, Dec. 1976.

Cullity, B.D., "Fundamentals of Magnetostriction", *Journal of Metals*, 35–41, (Jan. 1971).

Cullity, B.D., "Introduction to Magnetic Materials", Table of Contents, Addison–Wesley Publishing Company, Reading, MA Dec. 1972.

Feron, J.L., et al., "Magnetische Eigenschaften von Einigen Einkristallinen Seltenen Erden", *30. Bd., Heft 1*, 61–64, (May 16, 1970).

Greenough, R.D., et al., "AC Losses in Grain Oriented $Tb_{0.3}Dy_{0.7}Fe_{1.95}$", *IEEE Transaction on Magnetics*, 26, 2586–2588, (Sep. 1990).

Jiles, D., *Introduction to Magnetism and Magnetic Materials 1st Edition*, Table of Contents, Chapman and Hall, New York, NY 10001, 6, Dec. 1991.

Jiles, D.C., "The Development of Highly Magnetostrictive Rare Earth—Iron Alloys", *Journal of Applied Physics D: Applied Physics 27*, Printed in the UK, 1–11, Dec. 1994.

Jiles, D.C., et al., "Barkhausen Effect and Discontinous Magnetostriction in Terfenol–D", *Journal of Applied Physics 64*, 5417–5418, (Nov. 15, 1988).

Legvold, S., "Rare Earth Metals and Alloys", *Ferromagnetic Materials*, 1, North–Holland Publishing Company, A Handbook on the Properties of Magnetically Ordered Substances, 183–295, Dec. 1980.

Lord, D.G., et al., "X–Ray Topography Observation of a $Dy_{0.73}Tb_{0.27}Fe_{1.95}$ Crystal", *Journal of Magnetism and Magnetic Materials*, 29, 137–140, Dec. 1982.

Meeks, S.W., et al., "Acoustic Resonance of a Rare Earth Iron Magnetostrictive Rod in the Presence of Large Eddy Currents", *IEEE Transactions on Sonics and Ultrasonics*, SU–27, 60–65, (Mar. 1980).

Neel, M.L., "Anisotropie Magnetique Superficielle et Surstructures D'Orientation", *Le Journal De Physique Et Le Radium—T. 15.—N 4*, 15, 226–239, (Apr. 1954).

Pulvirenti, P.P., et al., "Enhancement of Piezomagnetic Response of Highly Magnetostrictive Rare Earth–Iron Alloys at kHz Frequencies", *Journal of Applied Physics*, 79, 6219–6221, (Apr. 15, 1995).

Reed, I.M., et al., "Characterisation of Magnetostrictive Materials with Computer Modelling", *IEEE Transactions on Magnetics*, 29, 2386–2388, (Nov. 6, 1993).

Reed, I.M., et al., "Frequency Dependence of the Piezomagnetic Strain Coefficient", *IEEE Transactions on Magnetics*, 31, 4038–4040, (Nov. 1995).

Rhyne, J.J., et al., "Magnetostriction of TB Single Crystals", *Physical Review*, 138, A507–A514, (Apr. 19, 1965).

Sablik, M.J., et al., "Coupled Magnetoelastic Theory of Magnetic and Magnetostrictive Hysteresis", *EEEE Transactions on Magnetics*, 29, 2113–2123, (Jul. 1993).

Verhoeven, J.D., et al., "The Effect of Composition and Magnetic Heat Treatment on the Magnetostriction of $Tb_xDy_{1-x}Fe_y$ Twinned Single Crystals", *Journal of Applied Physics*, 66, 772–779, (Jul. 15, 1989).

Verhoeven, J.D., et al., "The Growth of Single Crystal Terfenol–D Crystals", *Metallurgical Transactions A*, 18A, 223–231, (Feb. 1987).

Chin, T., et al., "Magnetostrictive Properties of $Tb_{0.3}Dy_{0.7}(Fe_{1-x}V_x)_2$ Alloys", *IEEE Transactions on Magnetics*, vol. 33, No. 5, 3946–3948, (Sep. 1997).

Greenough, R., et al., "Magnetostriction in Single Crystal Aluminum–Iron Alloys", *International Conference on the Physics of Transition Metals*, Conference Series No. 55, 327–330, Dec. 1980.

Prajapati, K., et al., "Magnetoelastic Effects in Rare–Earth Iron–Aluminum Compounds", *Journal of Applied Physics*, vol. 73, 6171–6173, (May 1993).

Tang, Y., et al., "Ga Substitution Effect on Magnetic and Magnetostrictive Properties of TbFe2 Compounds", *Journal of Applied Physics*, vol. 76, 7145–7147, (Nov. 1994).

Wu, L., et al., "The Effects of Boron on the Magnetostrictive Properties of $Tb_{0.27}Dy_{0.73}Fe_2$", *Journal of Alloys and Compounds*, 216, 85–87, Dec. 1994.

\* cited by examiner

MAGNETOSTRICTIVE MATERIALS AND METHOD FOR IMPROVING AC CHARACTERISTICS IN SAME

This application claims priorty to Ser. No. 60/028,514 filed Oct. 18, 1996.

STATEMENT OF GOVERNMENT RIGHTS

This invention was made with support of the United States Government under United States Department of Energy Contract No. W-7405-ENG-82. The Government has certain rights in this invention.

TECHNICAL FIELD OF THE INVENTION

The present invention relates to improving the frequency response of magnetostrictive materials, and particularly to improving the frequency response of rare-earth-iron alloys such as Terfenol-D materials.

BACKGROUND OF THE INVENTION

Ferromagnets are substances which undergo magnetostriction and also have a high magnetic permeability, a definite saturation point, significant residual magnetism and hysteresis. Examples of ferromagnets include iron, cobalt, nickel and their compounds, several rare earths and their compounds, and a class of copper-manganese-tin alloys known as "Heusler" alloys. The atomic magnetic moments in ferromagnets are arranged in volumes consisting of parallel alignments of magnetic moments called domains.

This is in contrast to diamagnets and paramagnets which do not have domains. Diamagnets such as copper, silver and gold as well as superconductors further do not have net permanent atomic magnetic moments in the absence of a magnetic field, because individual electronic spins cancel each other out. Although paramagnets such as tin, aluminum and tungsten actually have net permanent atomic magnetic moments, the moments point in random directions, leading to no net magnetization in the absence of a magnetic field.

The basic principles of magnetism as well as the mathematical relations between the various magnetic properties are further discussed on pages 1–24 in U.S. Pat. application Ser. No. 08/953,192 filed on Oct. 17, 1997 (hereinafter "Application") which are hereby incorporated by reference.

The energy of a material is known to be minimized when domains are present. Specifically, the magnetocrystalline anisotropy energy (anisotropy), which represents only a portion of the total energy in ferromagnetic materials, is minimized in the presence of domains because of the property known as magnetostriction. Magnetostriction refers to a change in the dimensions of the ferromagnetic body caused by a change in its state of magnetization. Specifically, magnetostriction is the fractional change in length along the direction of magnetization.

The origin of magnetostriction can be described following Néel's theory in terms of an exchange interaction between atomic magnetic moments. (L. Néel, *Anisotropie Magnetique Superficielle et Surstructures D'orientation*, J. Phys. Rad., 15, 227 (1954)), which is hereby incorporated by reference in its entirety. The exchange interaction, however, does not contribute to anisotropy since it only depends on the angle between moments and not the angle between the moments and the lattice. Anisotropy depends on the direction the moments make relative to the bond direction and results from a strong coupling between the "orbit" of an electron and the lattice of a crystal. Specifically, the electronic orbital moment interacts with the lattice by way of overlapping electron wave functions of the neighboring atoms. The "spin" of the electron is also indirectly coupled to the lattice due to a weak Russell-Saunders spin-orbit coupling. It is clear, therefore, that there is a relation between magnetization direction and the crystal axes.

In fact, the most important aspect of the relation between anisotropy energy (or anisotropy) and magnetostriction is the strain dependence of the anisotropy. Inherent in the anisotropy is a dependence on the state of strain of a crystal. Therefore, magnetostriction occurs because the anisotropy energy is minimized when the lattice deforms. The strain dependent part of the anisotropy energy is simply the sum of a magnetoelastic energy $E_{me}$ and an elastic energy, $E_{el}$ when total energy minimization or equilibrium is reached for finite strains.

Beginning with this known relationship, further mathematical relationships can be developed to describe the equilibrium strain state of a magnetostrictive material. It is also possible to determine the strain in a particular direction as well as the saturation magnetostriction in a particular direction. However, because any random domain distribution can be a "demagnetized state," it is not possible to define the demagnetized state uniquely. As a result, the magnetic saturation is used as the reference state since saturation is uniquely defined. To determine the magnetic saturation in a given direction, therefore, the saturation strain with magnetization, M, applied perpendicular to the given direction is typically subtracted from the saturation strain along that same given direction.

Therefore, the higher the anisotropy, the higher the field strength one needs to achieve magnetic saturation, and hence the higher the magnetostriction. For example, while the magnetostrictions of the 3d transition ferromagnets iron, cobalt and nickel are of the order of 20 ppm, the magnetostrictions of some of the rare earth-transition metal alloys are of the order of 1500 ppm or greater.

Material composition is one of the most important factors which influences magnetostriction. It is known, for example, that the magnetostriction of terbium, dysprosium and iron alloys is very sensitive to the relative concentrations of rare earth, and of rare earth to iron. Material microstructure also plays an important role in magnetostriction as well because the grain size and defect density are significant factors to consider for large strain.

Clearly, the mechanical state of a magnetostrictive material is intimately related to its magnetic state. This relationship can also be mathematically quantified with thermodynamic equations of state, or the magnetomechanical constitutive equations. It is important to keep in mind, however, that the magnetomechanical constitutive equations are defined for linear, reversible, nonhysteretic behavior, so they are approximations which are often impractical for ferromagnetic materials.

The development of various mathematical relationships relating to magnetostriction which focus on a "static" characterization of magnetostrictive materials is discussed in greater detail on pages 25 to 38 of Application which are hereby incorporated by reference. Of particular interest are two related parameters, i.e., an "energy conversion coefficient," $k^2$, which represents the ratio of mechanical energy to magnetic energy, and a "magnetomechanical coupling coefficient," k, which characterizes the magnetostrictive properties of materials, both static and dynamic. The most common method of static characterization for ferromagnetic materials including magnetostrictive materials is the hysteresis loop or curve, with the traditional curve being induction versus applied field and an alternate curve showing magnetostriction versus applied field. Pages 39–43 of Application, which are hereby incorporated by reference, discuss and show plots (FIGS. 2.2 and 2.3) of these two types of hysteresis loops for a material known as Terfenol-D, which is discussed in more detail below.

Although the mathematical relationships noted above focus on "static" characterization, it is possible to derive engineering parameters to characterize the "dynamic" frequency response of a magnetostrictive material. This is important because magnetostrictive materials for transducers and actuators are usually operated under ac conditions. Some of the mathematical relationships which focus on a "dynamic" characterization of magnetostrictive materials are discussed on pages 41 and 44–49 of Application, which are hereby incorporated by reference. It is important to note that under ac conditions, $k^2$ will be lower due to eddy current losses, such that k decreases with frequency. Another plot (FIG. 2.4) in Application shows the complex relative permeability for Terfenol-D under zero applied bias field. An offset relative to the expected theoretical component can be seen, which may be due to eddy currents or losses discussed below. These known mathematical relationships, however, do not fully characterize the properties of magnetostrictive materials, and a better characterization of these materials is necessary if they are to be fully understood and utilized in dynamic conditions.

As noted above, materials with high magnetostrictions are potentially useful in many dynamic or "ac" applications, including transducers and actuators/sensors for adaptive vibration control of sensitive optical equipment, automobiles, aircraft engines, and micropositioning of satellites. When operating under ac conditions, one of the most important considerations is the complex permeability of the material. During ac conditions, permeability is a complex quantity with a real part and an imaginary part. That is, it has an in-phase component and an out-of-phase component. The imaginary part, I, is the component of the induction, B, which is out of phase in reference to the applied magnetic field, H. The imaginary part is related to power losses in the material which partly result from the eddy currents that dissipate energy and limit the field penetration.

It is known that dynamic uses require a material having a high frequency response. The problem with many magnetostrictive materials is that they do not have the requisite high frequency response needed, primarily because they possess large eddy current losses. Such losses are apparent from a decrease in the effective permeability with frequency at fixed conductivity. Therefore, these materials have a permeability which remains constant for only a narrow frequency range.

For example, although the room temperature magnetostriction of a rare earth-iron alloy known as Terfenol-D (or Terfenol) along a cube diagonal [111], i.e., $\lambda_{111}$, has a magnitude of 1640 ppm, the conductivity of Terfenol is only $60 \times 10^8$ ohm-m, which significantly reduces the magnetic field penetration. (Terfenol refers to two pseudo-binary alloys with the compositions $Tb_{.3}Dy_{.7}Fe_2$ and $Tb_{.27}Dy_{.73}Fe_2$). Therefore, as the frequency increases, the skin depth of the Terfenol decreases, e.g., at 50 kHz the skin depth of Terfenol is typically 1.5 mm. (Further details, including a plot of skin depth versus log frequency for Terfenol are discussed on pages 74–76 of Application, which are hereby incorporated by reference.) The reduced skin depth limits the diameter of a Terfenol rod that can usefully be employed at any given frequency and consequently restricts the load-bearing capability of an actuator. It also results in a drastically reduced energy conversion efficiency as the frequency of excitation increases.

It should be noted that the research that led to the development of Terfenol was undertaken because of the unusual magnetic and magnetoelastic properties of the rare earths. Further details on the rare earths as well as the development, microstructure and magnetization process of Terfenol are discussed on pages 62–73 of Application which are hereby incorporated by reference.

There is a need, therefore, to extend the useful operating range of magnetostrictive materials such as Terfenol. Presently, as noted above, performance is limited by skin depth, which depends on the conductivity of the material, and decreases with frequency. What is needed is a material which retains its high magnetostrictive properties and skin depth in dynamic applications, but also has minimal eddy current losses and a high frequency response. There is also a need to understand and fully characterize the properties of magnetostrictive materials, such as Terfenol, under ac conditions.

SUMMARY OF THE INVENTION

The present invention provides Terfenol alloys ("doped Terfenol") having optimized performances under the condition of time-dependent magnetic fields. In one embodiment, performance is optimized by lowering the conductivity of Terfenol, thereby improving the frequency response. This can be achieved through addition of Group III or IV elements, such as silicon (Si) and aluminum (Al). Addition of these types of elements provides scattering sites for conduction electrons, thereby reducing energy losses at higher frequencies due to eddy current effects, thereby increasing resistivity. The permeability of doped Terfenol also remains constant over a wider frequency range as compared with undoped Terfenol.

Specifically, Terfenol doped with a suitable amount of either Al or Si shows an average increase in resistivity of 125% which leads to an average increase in penetration depth of 80% at one (1) kHz. These results demonstrate that Si and Al additions are effective in improving the ac characteristics of Terfenol. Such improved materials have an increased energy conversion efficiency so that they can be used effectively in dynamic applications including the generation and absorption of acoustic vibrations.

The present invention also provides a means by which to more fully characterize the properties of magnetostrictive materials. A "magnetostrictive" Grüneisen Parameter was developed, which allows characterization of the coupling efficiency in magnetostrictive materials. Furthermore, development of a preliminary source code for determining the eddy current factor is also provided which is useful in more accurately determining the complex permeability of a magnetostrictive material under ac conditions.

These and other features, aspects and advantages of the present invention will become better understood with regard to the following description, appended claims and accompanying drawings.

DETAILED DESCRIPTION OF THE INVENTION

Figure 1:
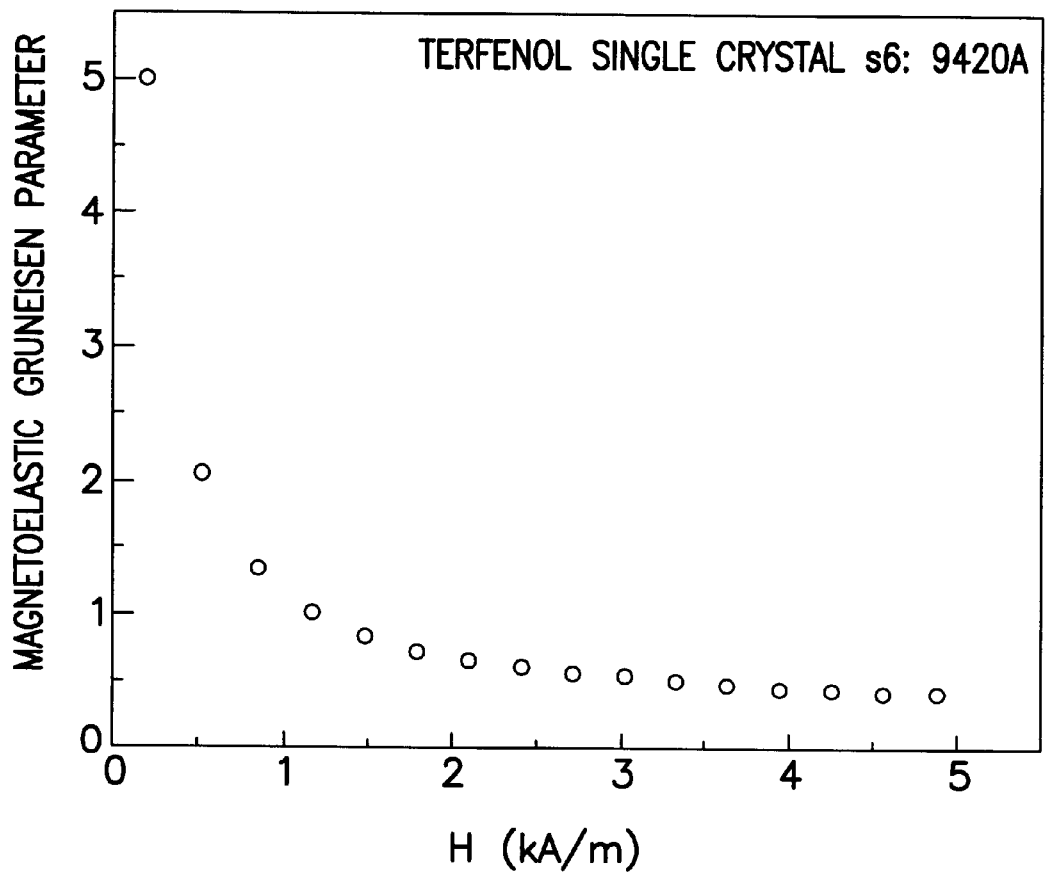
FIG. 1 is a plot of a magnetoelastic Grüneisen Parameter versus internal field (H) for a single crystal Terfenol sample.

The present invention provides doped Terfenol materials having improved frequency responses, such that the permeability of these materials remains constant over a wider frequency range as compared with undoped Terfenol. These materials also possess an enhanced magnetostriction amplitude, leading to an increased energy conversion efficiency when these materials are used as energy transducers. In one embodiment, performance is optimized by lowering the conductivity of Terfenol. This can be achieved through addition of Group III or IV elements, such as Si and Al, which provides scattering sites for the conduction electrons, thereby increasing resistivity.

Specifically, when Terfenol is doped with 1% of either Al or Si, there is an average increase in resistivity of 125% which leads to an average increase in penetration depth of 80% at 1 kHz, and an increase in energy conversion efficiency of 55%. These results demonstrate that the addition of impurities such as Si or Al is effective in improving the ac characteristics of Terfenol. Details of these experiments and other background information is contained in Application which is hereby incorporated by reference in its entirety.

Other known methods to enhance magnetostriction include applying a stress to a material in when the material is in a demagnetized state. This alters the domain structure by causing the moments to bias in such a way that they lie along a particular direction, e.g., perpendicular to the applied stress in a cylindrical sample, thus maximizing the magnetostriction along that axis. Because Terfenol is known to be brittle, however, applying such a stress may cause damage to the material.

Another known method of improving magnetostriction (or aligning the moments) is "magnetic annealing" which is annealing of a material in the presence of a magnetic field. In this manner the moments remain preferentially oriented in a particular direction after the field is removed. However, even though annealing might lead to improvements in magnetostriction of Terfenol in quasi-static or "almost-dc" fields, it will also likely cause the conductivity of materials such as Terfenol to increase, which is undesirable in ac fields.

The following description begins with a brief discussion of magnetostriction in terms of anharmonicity and the Grüneisen parameter. This includes details on the development of a novel and useful mathematical relationship between anharmonicity and the magnetomechanical coupling coefficient using a "magnetoelastic" Grüneisen parameter. The next section discusses the dynamic properties of Terfenol with details regarding related mathematical equations and specific experiments involving Terfenol samples covered in Example 3. The algorithm developed to calculate the eddy current factor in magnetostrictive materials is also noted, and is included herein as a "source code listing." Finally, the novel method of the present invention for lowering the conductivity of Terfenol to produce a novel material with a marked improvement in frequency response is discussed next, with details of the related experiments covered in Example 2.

Anharmonicity and the Grüneisen Parameter

The magnetostriction of a material, like the thermal expansion, is a result of anharmonicity in the crystal lattice. It is the volume dependence of the frequency of the lattice vibrations that gives rise to anharmonicity. For example, it is known that the magnetostriction coefficient in Terfenol and related materials is very large, and the anharmonicity should reflect this. Therefore (as shown on pages 58–61 of Application), a relationship can be developed between the third order (anharmonic) terms in the crystal potential and the magnetomechanical coupling coefficient, k. Specifically, a parameter known as a "magnetoelastic" Grüneisen parameter ($\gamma$) has now been developed and can be defined as:

$$\gamma_{me} = \frac{3 d_\sigma}{B \lambda s_H}$$

where B is the magnetic induction, and is saturated, $d_\sigma$ is the piezomagnetic strain coefficient at constant stress and $s_H$ is the elastic compliance at constant applied magnetic field, $E_H$. For other values of B where $B = \mu H$:

$$\gamma_{me} = \frac{3 d_\sigma}{H \mu_\lambda s_H}$$

where H is the applied magnetic field and $\mu_\lambda$ is the permeability at constant strain.

The magnetoelastic Grüneisen parameter can also be quantitatively related to the k coefficient and is proportional to k when it is assumed that $\mu_\lambda \sim \mu_\sigma$, at field strengths well below saturation:

$$k^2 = \gamma_{me} \frac{H d_H}{3}$$

A "thermoelastic" Grüneisen parameter is already known as one way of quantifying the anharmonicity, as it is the coefficient of proportionality which relates the fractional change in vibration frequency to the fractional change in volume when subjected to pressure. In fact, an expression for the thermoelastic Grüneisen parameter in terms of the force constant in the crystal lattice can be derived relatively simply. Basically, it is known that the fractional change in the vibrational frequency of the lattice as it is distorted gives the fundamental measure of anharmonicity. In fact, the ratio of the volume strain to the fractional change in vibration frequency is found to be linearly dependent on the third order coefficient of the interatomic potential. The thermoelastic Grüneisen parameter is thus a linear function of the third order coefficient of the lattice potential as discussed on pages 50–58 of Application.

Therefore, using Maxwell's relations from thermodynamics, which are applicable only for linear, reversible, nonhysteretic behavior, the thermoelastic Grüneisen parameter, $\gamma_{th}$, can be written as:

$$\gamma_{th} = \frac{3\alpha}{c_p \kappa_s}$$

where $c_p$ and $K_s$ are, respectively, specific heat at constant pressure and compressibility at constant entropy. By analogy, it can be shown that $\gamma_{me}$ can be written:

$$\gamma_{me} = \frac{3d_\sigma}{H\mu_\sigma s_M}$$

where $\mu_\sigma$ is the permeability at constant stress and $s_M$ is the elastic compliance at constant magnetization.

Figure 2:
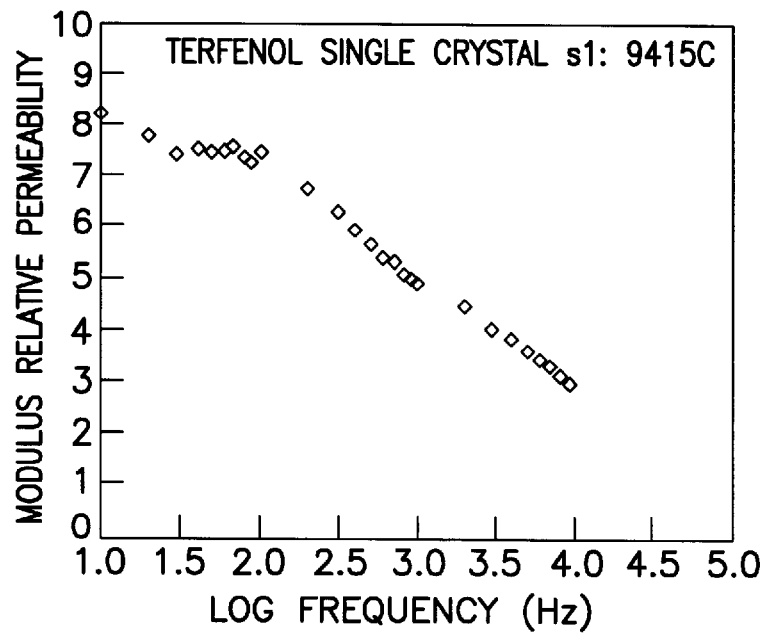
FIGS. 2, 3, 4, 5, 6 and 7 are plots of the modulus complex permeability, $\|\mu\|$ versus log frequency for six different single crystal samples of Terfenol.
Figure 3:
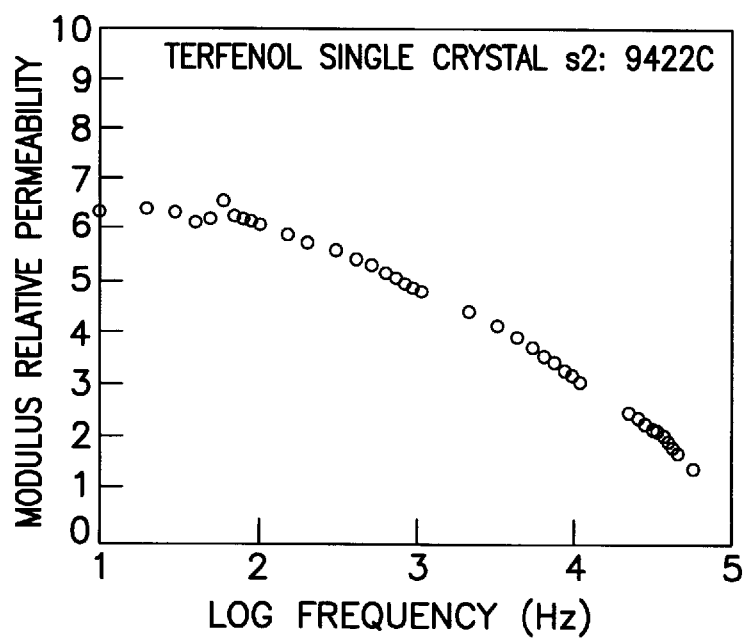

A significant difference between the magnetoelastic Grüneisen parameter developed herein and the well-known thermoelastic Grüneisen parameter is that the latter is substantially independent of temperature and the former is dependent on applied magnetic field. FIG. 1 shows the magnetoelastic Grüneisen parameter as a function of applied magnetic field for a single crystal sample of Terfenol-D with dimensions d=6 mm and l=50 mm. The magnetoelastic parameter was calculated from the equation noted above using data from the B-H loop and the λ-H loop plotted in FIGS. 2.2 and 2.3 of the Application (see pages 39–43 of Application).

The magnetoelastic Grüneisen parameter is known to be proportional to the magnetomechanical coupling coefficient, k, and therefore provides a means by which to characterize the coupling efficiency in magnetostrictive materials. In addition, the relation of the thermoelastic Grüneisen parameter to the anharmonic coefficient offers a means to determine the anharmonicity in the crystal potential of a magnetostrictive material. It may also be possible to relate the magnetoelastic Grüneisen parameter to the strain dependent anisotropy constants (in addition to being related to the vibrational frequencies of the lattice, the anharmonic coefficient of the lattice potential, and the magnetomechanical coupling coefficient).

Dynamic Properties of Terfenol

As noted above, the ac characterization of a magnetostrictive material is very important, with complex permeability being one of the most important properties which must be considered. Example 1 and FIGS. 2–8 detail the results of experiments with six different single crystal specimens and one polycrystalline sample of Terfenol wherein the modulus relative permeability initially remained constant but then started to drop off as the frequency was increased. As discussed below, this point is usually referred to as the critical frequency, $f_c$, which is known to vary from sample to sample.

It is also possible to describe an ac quantity such as the complex permeability in terms of an eddy current factor, $\chi$. The eddy current factor is a function which has the same form as the complex permeability. In fact, one should be able to use the eddy current factor to model any complex quantity. The dc value is simply multiplied by $\chi$ and a complex function results. A numerical expression for the eddy current factor can be calculated.

One method of determining the eddy current factor is with the algorithm created during the development of this invention which is noted on pages 24–26 herein. Basically, the eddy current factor can be described as:

$$\chi = \chi_r - i\chi_i$$

where $\chi_r$ and $\chi_i$ are the real and imaginary components of $\chi$ and i is $\sqrt{-1}$. The equivalent dc quantity is multiplied by $\chi$ and the result is the ac quantity as a function of frequency. The expression for $\chi$ derives from Bessel's equation which is discussed in greater detail on pages 86–88 of Application.

The resulting equations for $\chi_r$ and $\chi_i$ are expressed as power series sums as follows:

$$\chi_r = \frac{\sum_{k=0}^{\infty} \frac{\left(\frac{q}{4}\right)^{2k}}{(k!)^2(2k+1)!}}{\sum_{k=0}^{\infty} \frac{\left(\frac{q}{4}\right)^{2k}}{(k!)^2(2k)!}}$$

$$\chi_i = \frac{2\sum_{k=0}^{\infty} \frac{\left(\frac{q}{4}\right)^{2k} 2k}{(k!)^2(2k)!}}{q\sum_{k=0}^{\infty} \frac{\left(\frac{q}{4}\right)^{2k}}{(k!)^2(2k)!}}$$

To a first approximation, the frequency response of a material depends only on this characteristic frequency, $f_c$, for a given specimen. The "simulated" complex permeability curves for Terfenol are shown in FIGS. 9–12. The critical frequencies shown in FIGS. 9–12 are at 50, 100, 500 and 1000 Hz, respectively. For each of these plots j=10 "terms," while n=101 "points" for FIG. 9 and 110 "points" for FIGS. 10–12. "Terms" refers to the number of power series sums noted above for $\chi_r$ and $\chi_i$, and "points" refers to the mathematical number of points used to calculate $\chi_r$ and $\chi_i$. Note that the dotted lines are the real component, $\chi_r$, and the dashed lines are the imaginary component, $\chi_i$. However, there can be other influences which affect the frequency dependent properties of a material and it is also desirable to incorporate these "anomalous losses" in the expression for permeability.

Figure 9:
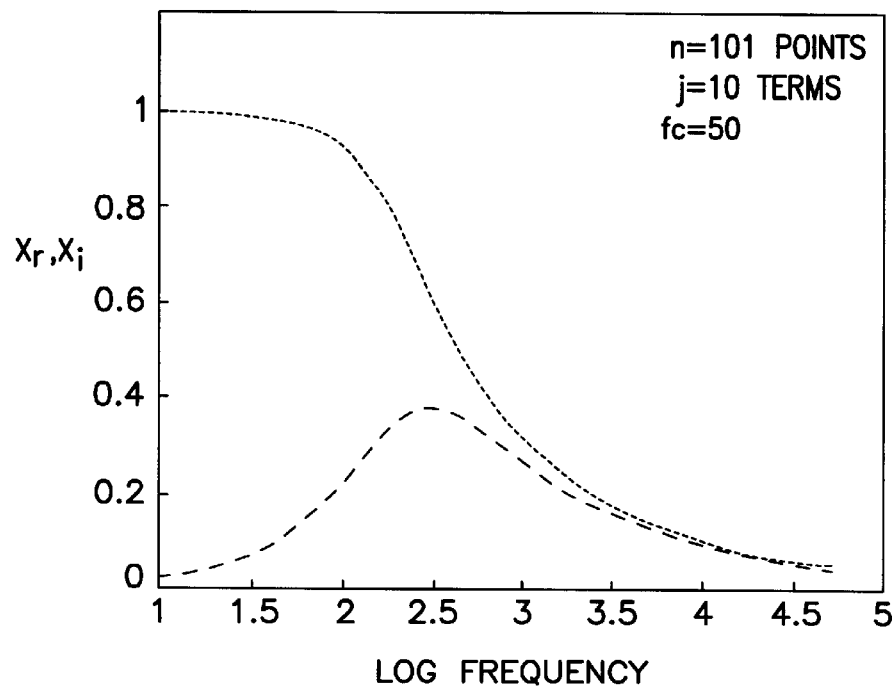
FIGS. 9, 10, 11 and 12 are plots of the eddy current factor versus log frequency for Terfenol at a critical frequency of 50, 100, 500 and 1000 Hz, respectively.
Figure 10:
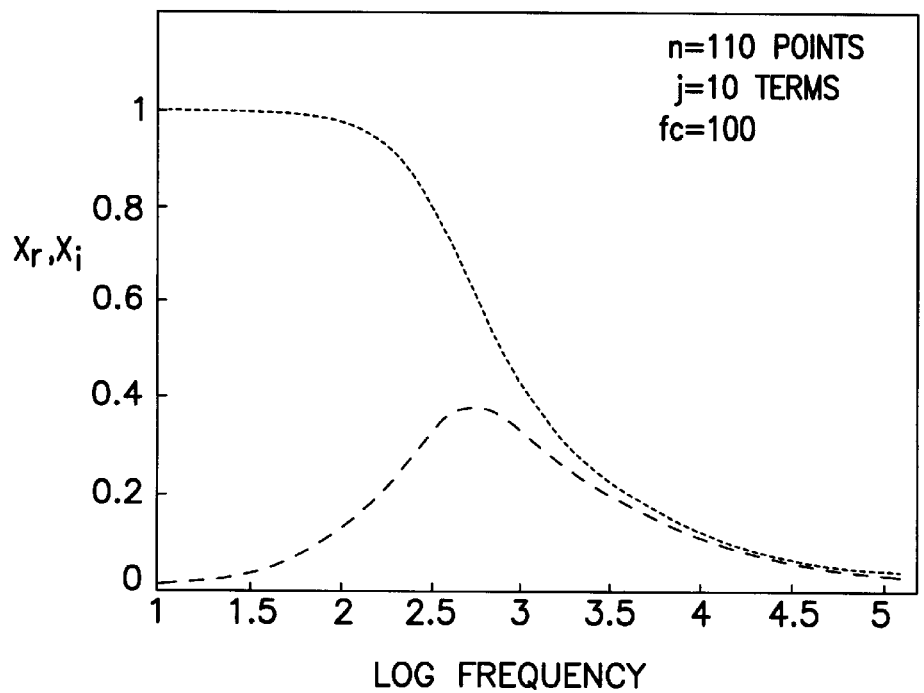
Figure 11:
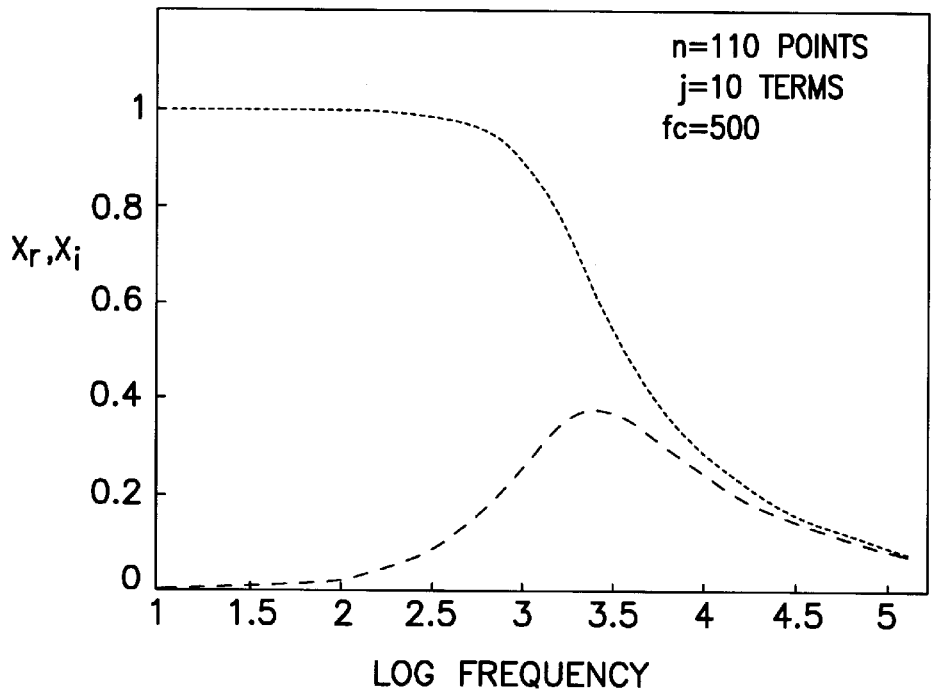
Figure 12:
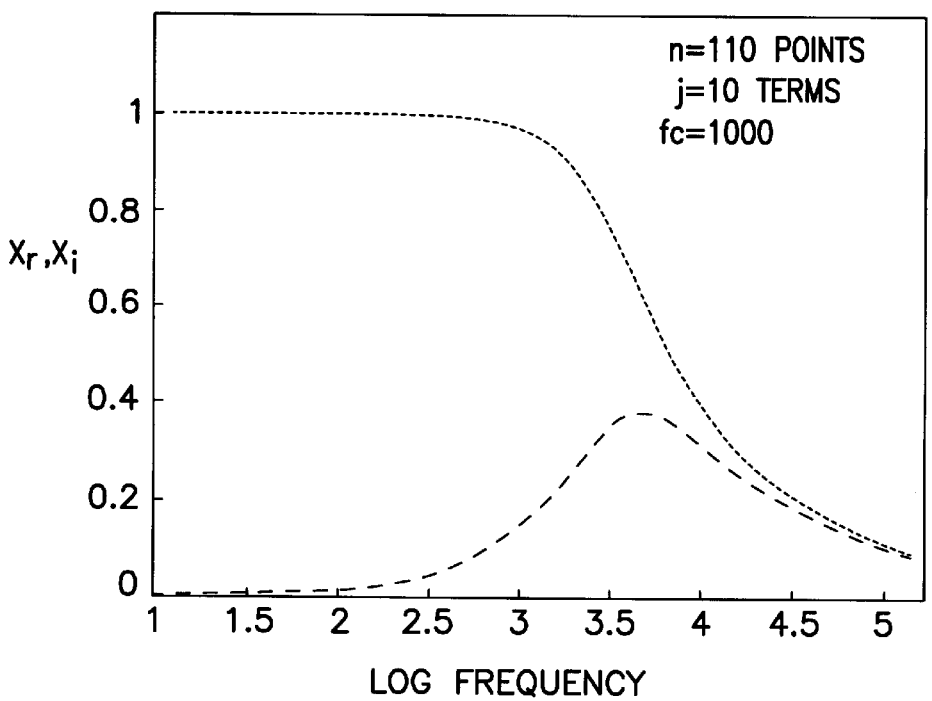

Upon examination, one finds that the shape of the curves in FIGS. 9–12 varies only with $f_c$. For example, FIG. 9 shows the eddy current factor for Terfenol at a critical frequency of 50 Hz. This would represent a material with a complex permeability that remained constant for a narrow frequency range. It is not possible to infer from this information anything about the physical processes which cause the drop in permeability. Similarly, a material with a complex permeability curve such as in FIG. 12 at a critical frequency of 1000 Hz would seem to indicate an improved frequency response, but again there is no reference to the physical processes. It is therefore also desirable, as noted above, to incorporate the so-called anomalous losses (losses due to microscopic eddy currents around the domain walls) as well as the classical losses in the expression for permeability (or the eddy current factor).

It is also possible to develop suitable mathematical expressions for effective permeability as discussed on pages 93–95 of Application. Several assumptions can be made for ease of calculation, such as assuming that the intrinsic permeability is independent of frequency and of $r_i$, which is the radius of the cylinder that is not penetrated by an alternative magnetic field. When the skin depth, $\delta$, is equal to $r_o$, the radius of the cylindrically-shaped sample, the effective permeability and intrinsic permeability are equal, which is simply the dc permeability.

If it is assumed that the maximum skin depth is $r_o$ and the minimum skin depth is zero, the effective permeability can be expressed as:

$$\mu_{eff} = \left( \frac{2\sqrt{\rho}}{\sqrt{\pi \mu_{int} f r_o}} - \frac{\rho}{\pi \mu_{int} f r_o^2} \right)(\mu_{int} - \mu_o) + \mu_o$$

Figure 13:
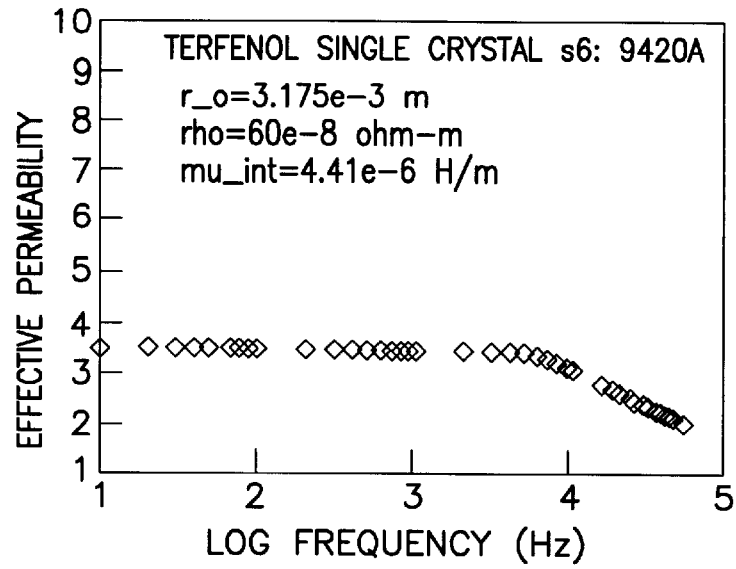
FIG. 13 is a plot of the effective permeability versus log frequency for a single crystal Terfenol sample.
Figure 14:
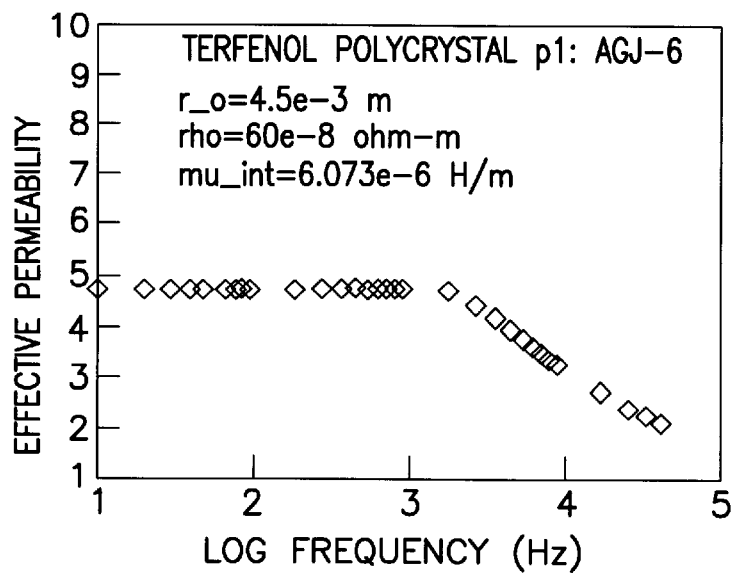
FIG. 14 is a plot of the effective permeability versus log frequency for a polycrystalline Terfenol sample.
Figure 15:
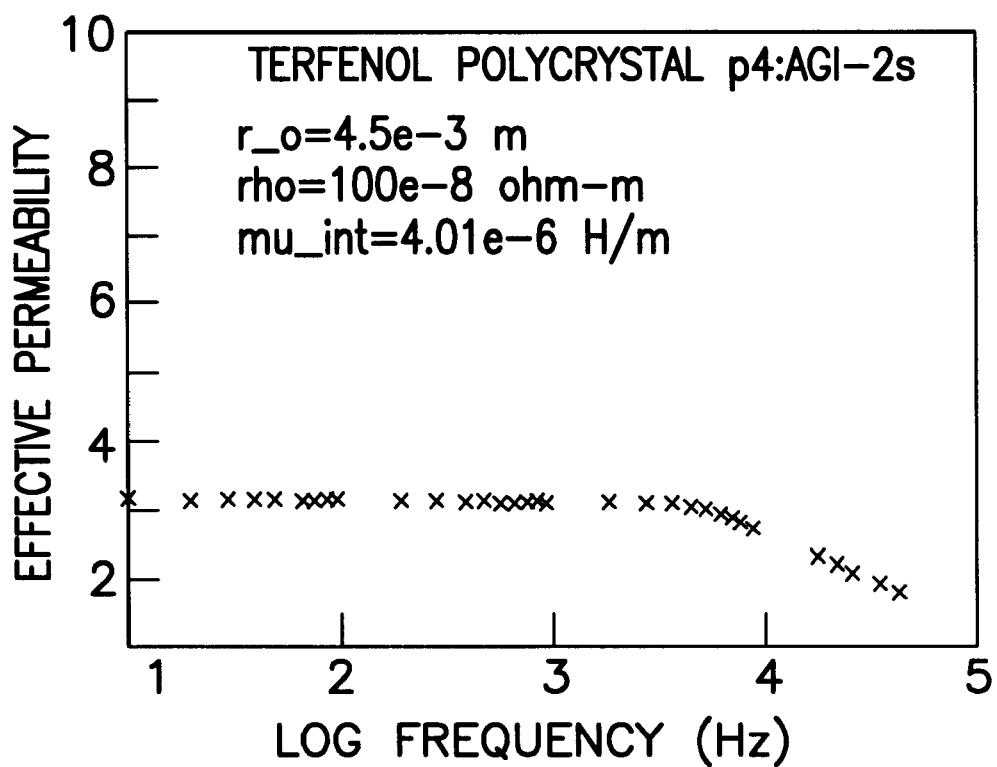
FIG. 15 is a plot of the effective permeability versus log frequency for a polycrystalline sample comprised of Terfenol with one (1)% Si added in one embodiment of the present invention.

For $\delta = r_o$, one can see that $\mu_{eff} = \mu_{int}$ which is simply the dc permeability based on the assumption made above. However, because of the limitations of $\delta(f)$, it is necessary to accept only certain values of $\delta$ for the above equation to satisfy the boundary conditions for skin depth. As will be seen in Examples 1 and 2 (FIGS. 2–8 and FIG. 20) below, wherein the "modulus permeability" is determined experimentally for several Terfenol samples, the theoretical "effective permeability" is a valid approximation. Specifically, FIGS. 13–15 show the theoretical "effective permeability" versus frequency for a single crystal sample of Terfenol (Sample No. 6), a polycrystalline sample of Terfenol, and a polycrystalline sample of Terfenol with 1% Si added, respectively. The intrinsic permeability was taken to be a quasi dc permeability for a frequency of 10 Hz. The resistivity was measured for each sample and agreement with experiment is satisfactory considering all the assumptions made. Results could improve with the incorporation of the eddy current factor, i.e., a term due to excess losses, or an expression of that form, as suggested above and in *Physical Interpretation of Eddy Current Losses in Ferromagnetic Materials. I. Theoretical Considerations* and *Physical Interpretation of Eddy Current Losses in Ferromagnetic Materials. II. Analysis of Experimental Results* by G. Bertotti, J. Appl. Phys., 57 (1985), pages 2110 and 2118, respectively, and in *Introduction to Magnetic Materials*, by B. D. Cullity, Adison Wesley, publ., Reading, Mass. (1972), which are all hereby incorporated by reference in their entirety. Such a modification requires that the structural features and the domain dynamics be taken into account.

Method for Reducing Conductivity of Terfenol

In order to minimize the eddy current losses, which are apparent from the decrease of effective permeability with frequency at fixed conductivity, it is necessary to reduce the conductivity of Terfenol. In one embodiment Terfenol is doped with a group III or IV element. As noted above, these impurity atoms provide scattering sites for conduction electrons and thereby increase resistivity. They also reduce the density of states at the Fermi level and may increase the penetration depth of an alternating magnetic field in Terfenol.

Specifically, nine samples of polycrystalline Terfenol with various alloying additions were made by the drop cast method. These were compared with one undoped polycrystalline sample and six undoped single crystal samples. Samples were made with 1%, 2% and 3% Al, 1%, 2% and 3% Si, and 1%, 2% B, and undoped Terfenol. The details of the experimental procedure and the results for some of the above samples are covered in Examples 1 (FIGS. 2–8), Example 2 (FIGS. 16–21) as well as in Pulverenti.

The addition of elements such as aluminum, silicon or boron to Terfenol is thought to have two main effects: (i) increase resistivity and (ii) decrease magnetostriction. The first of these is clearly desirable for improving the frequency response of the material. The second is undesirable. It is therefore possible that the trade off between these two effects will lead to an optimum amount of alloying additions at which the energy conversion efficiency reaches a maximum was found to be true. The optimum level of alloying additions in the specimens that were investigated appear to be close to 1%. In the case of the 1% boron, however, the material was so brittle that we were unable to produce a suitable specimen for the measurements of its bulk magnetic properties.

The invention will be further described by reference to the following examples which are offered to further illustrate various embodiments of the present invention. It should be understood, however, that many variations and modifications may be made while remaining within the scope of the present invention.

EXAMPLE 1

Experimental Procedure

In this experiment measurements of complex permeability were taken as a function of frequency for one undoped polycrystalline samples and for six different twinned single crystal samples of Terfenol. A lock-in amplifier was used to analyze the voltage signal from a flux coil of 50 turns wound about the sample. It also provided the reference signal for the solenoid which generated the applied magnetic field. An ac magnetic field amplitude of 240 A/m (3 Oe) was applied at frequencies in the range of 10 Hz–50 kHz. Some of the results of this experiment are also discussed on pages 100–111 and 120–126 of Application and in P. P. Pulverenti, et. al., *Enhancement of Piezomagnetic Response of Highly Magnetostrictive Rare Earth-Iron Alloys at kHz Frequencies*, J. Appl. Phys., 79 (8), pp. 6219–6221 (Apr. 15, 1996) (hereinafter "Pulverenti"). The single crystal specimens which were used all had the same dimensions, i.e., d=6 mm and l=50 mm. It is also important to note that the measurement conditions for all samples in FIGS. 2–8 were the same.

Results

FIGS. 2–8 show complex permeability as a function of frequency for the six different samples of a single crystal specimen of Terfenol and one polycrystalline sample of Terfenol. As can be seen in FIGS. 2–7, the permeability of each single crystal specimen remains constant but then starts to drop off as the frequency is increased. As noted above, this point is usually referred to as the critical frequency, which varies from sample to sample, as with most properties of Terfenol.

Figure 4:
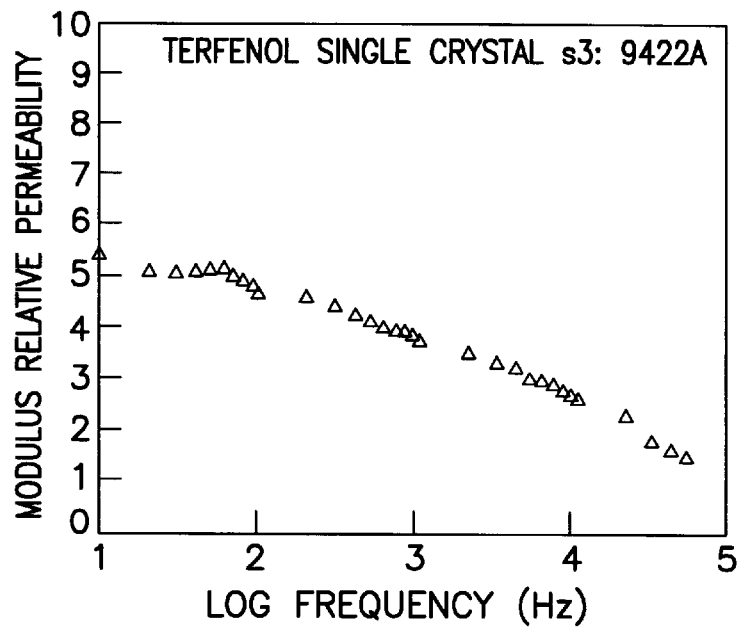
Figure 5:
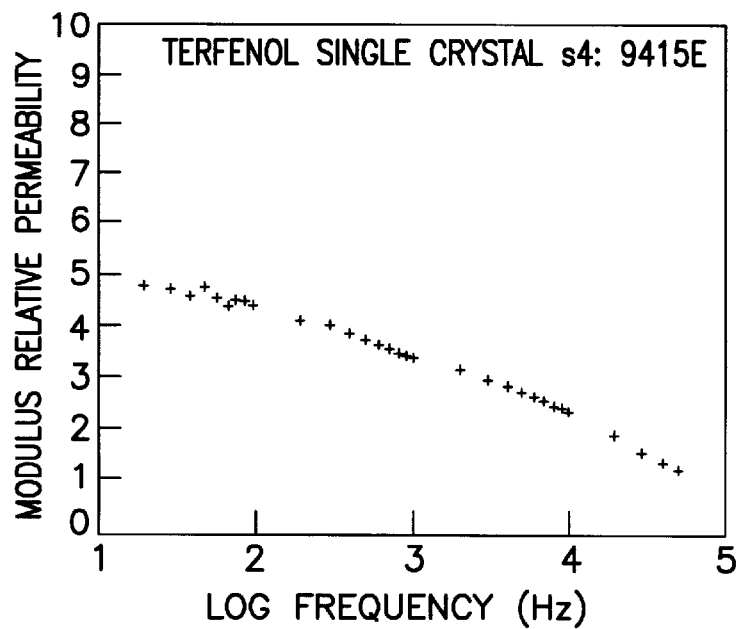
Figure 6:
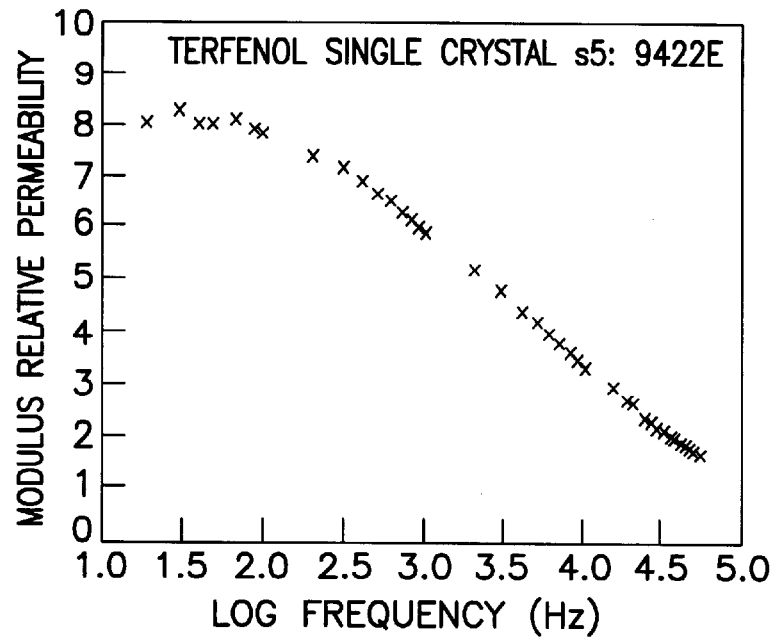
Figure 7:
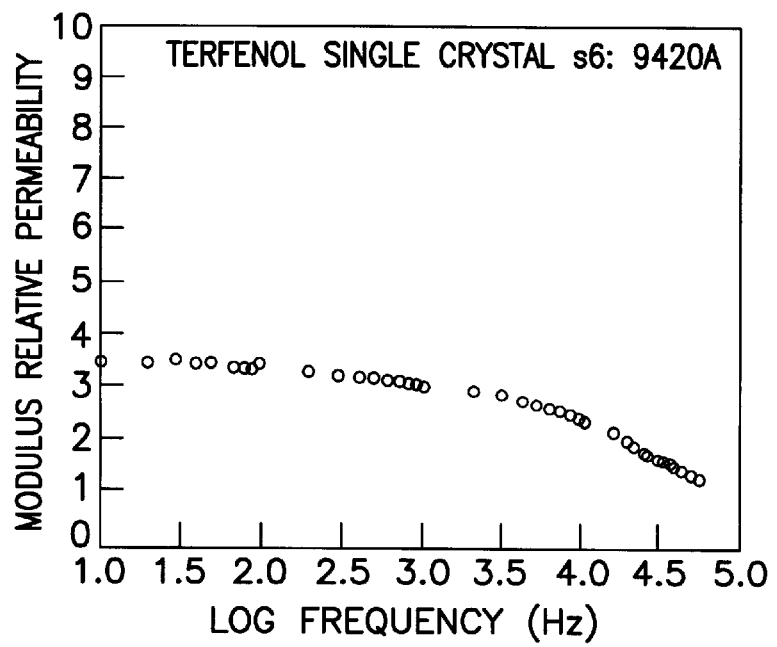

One of the characteristics of Terfenol is that a particular property will vary from sample to sample. For example, samples 4 and 5 (FIGS. 5 and 6) are from the same rod of material, yet their complex permeability curves are quite different. Similarly, samples 1 and 2 (FIGS. 2 and 3) come from the same rod of material as do samples 3 and 6 (FIGS. 4 and 7). The only similarity in these curves is that their complex permeabilities both are lower (in general) than in the other samples. It is this variability which makes it necessary to properly characterize each sample.

Figure 8:
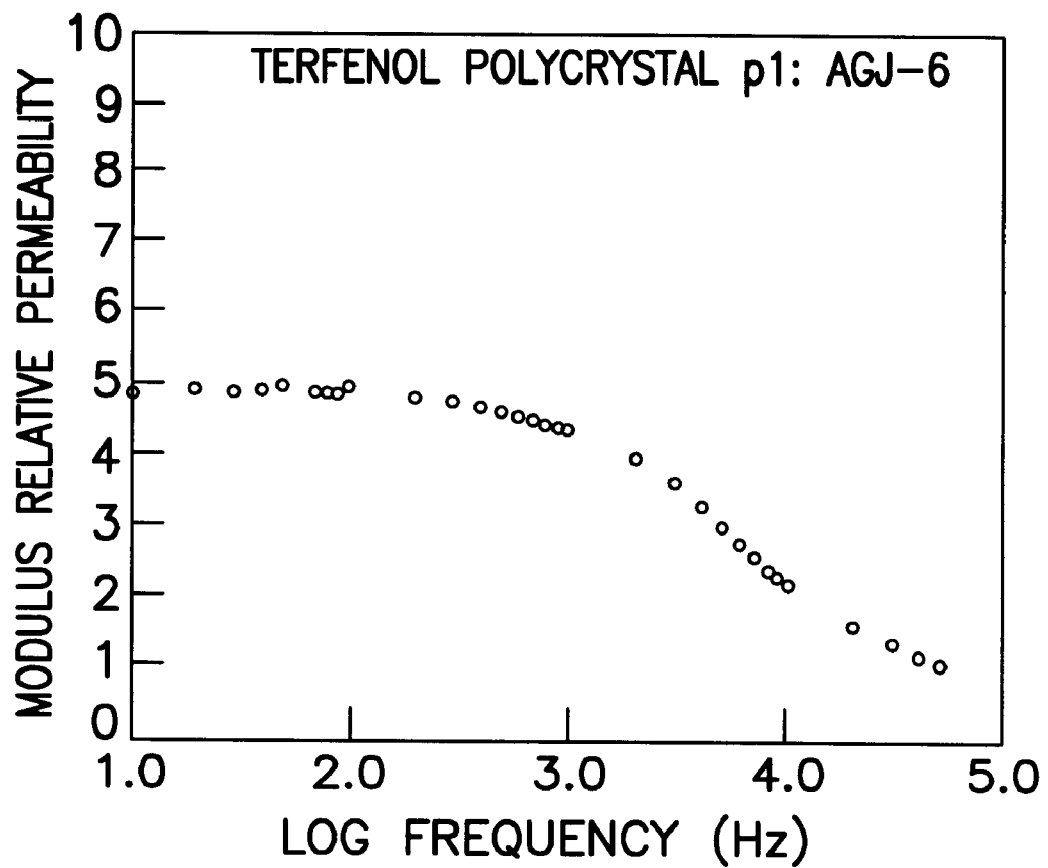
FIG. 8 is a plot of the modulus complex permeability, $\|\mu\|$, versus log frequency for a polycrystalline sample of Terfenol.

FIG. 8 shows complex permeability for a polycrystalline Terfenol sample having the dimensions, d=9 mm, l=55 mm.

The complex permeability of this polycrystalline Terfenol sample is at the lower end of the range, as expected. Specifically, the presence of grain boundaries results in increased losses and inhibits field penetration.

EXAMPLE 2

Experimental Procedure

In this experiment measurements of complex permeability were taken as a function of frequency for both doped and undoped polycrystalline samples and for the same six undoped twinned single crystal samples of Terfenol noted in Example 1, using the same experimental procedure noted in Example 1. However, in both this Example and in Pulverenti, only two of the undoped samples are used as comparisons with the doped samples, namely: the undoped single crystal Terfenol sample no. 6 (see FIG. 7) and the undoped polycrystalline Terfenol sample (see FIG. 8). Furthermore, only the results for Terfenol samples doped with 1% Al or 1% Si are compared with the above two undoped samples.

Resonance Measurements

In this experiment, the performance of the materials was quantified in terms of the two piezomagnetic coefficients $$d = \left(\frac{d\lambda}{dH}\right)_B \quad \text{and} \quad g = -\left(\frac{d\lambda}{dB}\right)_\sigma$$

and the magnetomechanical coupling coefficient k. Real and imaginary components of the piezomagnetic strain coefficient g, elastic compliance s, and complex permeability $\mu$, were determined for the polycrystalline rods of varying compositions, each approximately 50 mm long and nine (9) mm in diameter. The coupling factor, k, was also obtained from the magnetomechanical resonance in the rods using the above two equations. Only real values were used in the calculation of k. (The two methods for calculating k are the "resonance" method and the "three parameter" method discussed in detail in Application on pages 45–49).

With no applied prestress, a longitudinal dc bias field of 52 kA/m was sufficient to obtain maximum coupling for each sample. The frequency of an oscillatory excitation field of amplitude 80 A/m was swept through the resonance and data for the amplitude and phase of the emf induced in the flux coil wound close to the sample were recorded continuously through the whole resonance region. For the polycrystalline samples, the calculated values of coefficients, g, $\mu$, and $s_B$, were corrected for the effects of specimen shape and resonant frequency using a plane wave model as described in *Frequency Dependence of the Piezomagnetic Strain Coefficient* by I. M. Reed, et. al., IEEE Trans. Mag., 31 (6), 4038 (1995), which is hereby incorporated by reference in its entirety.

Specifically, a comparison was made of the measured response with that predicted from a model based on plane acoustic wave propagation in a magnetoelastic medium (see Reed, et. al, IEEE Trans. Mag. (1995) above and L. M. Reed, et. al., *Characterisation of Magnetostrictive Materials with Computer Modelling*, IEEE Trans Mag. Proc., 29 (6), 2386 (1993), both of which are hereby incorporated by reference in its entirety). Values for the piezomagnetic strain coefficient g, permeability at constant strain $\mu$, and the elastic compliance at constant induction $s_B$, enabled the magnetomechanical coupling coefficient k to be calculated. The values obtained for k are not particularly high because the samples were not grain oriented and consequently the coupling was relatively insensitive to uniaxial prestress and dc bias field.

Figure 16:
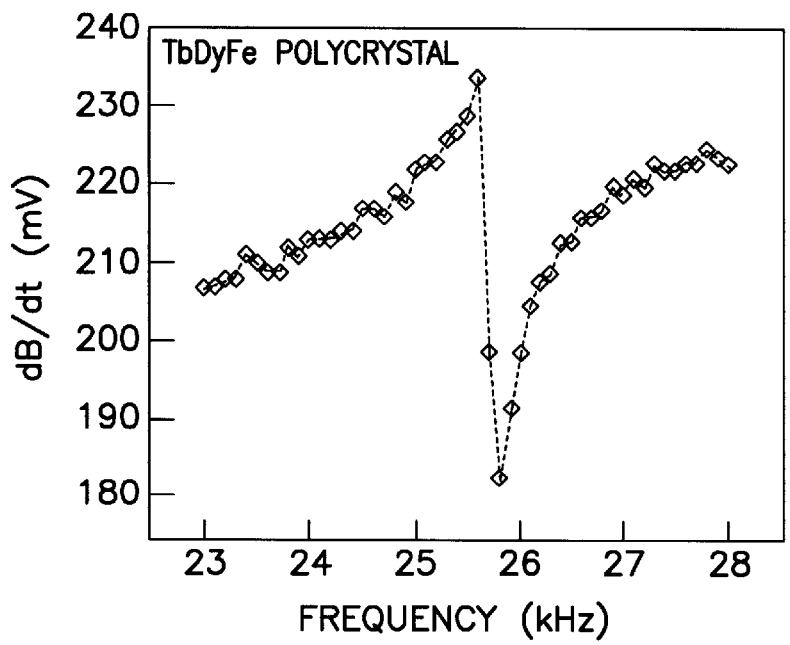
FIG. 16 is a plot of the resonance and antiresonance for polycrystalline Terfenol.
Figure 17:
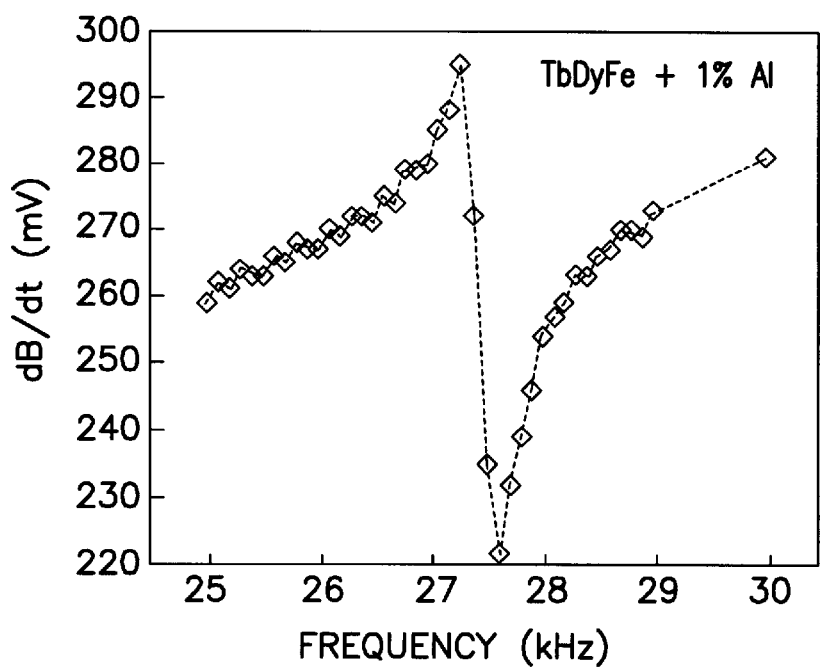
FIG. 17 is a plot of resonance and antiresonance for polycrystalline Terfenol with 1% Al added in one embodiment of the present invention.
Figure 18:
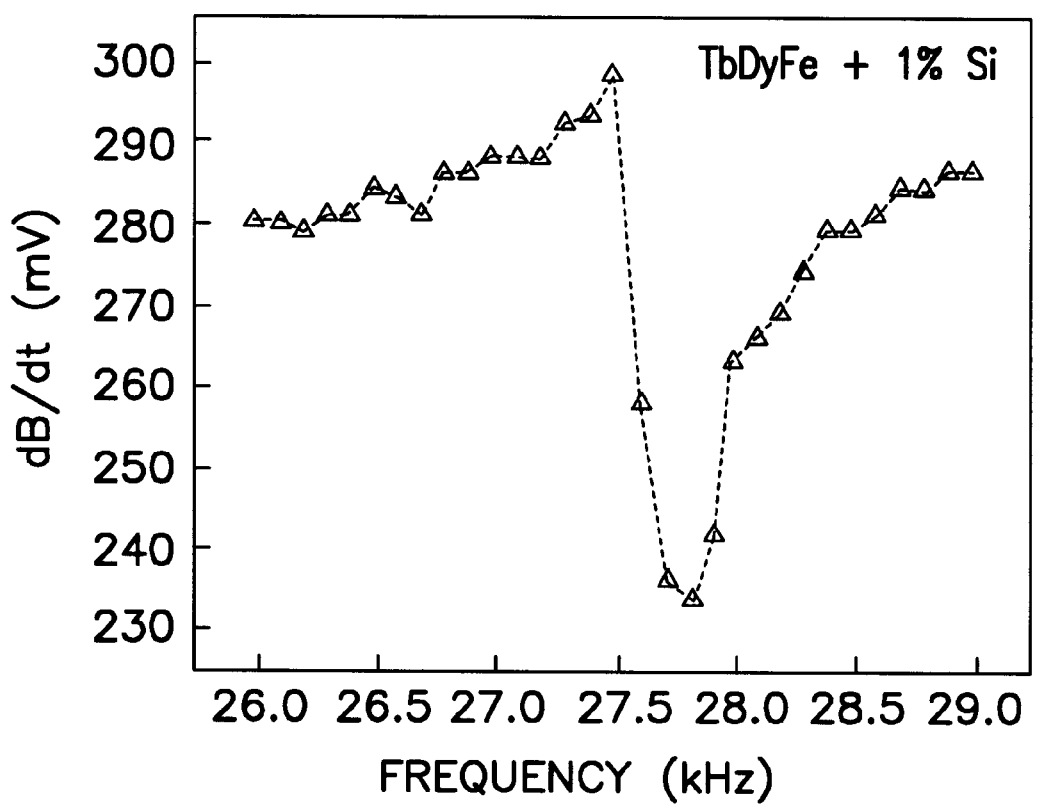
FIGS. 18 and 19 are plots of the resonance and antiresonance for the same polycrystalline Terfenol sample with one (1)% Si added in one embodiment of the present invention.
Figure 19:
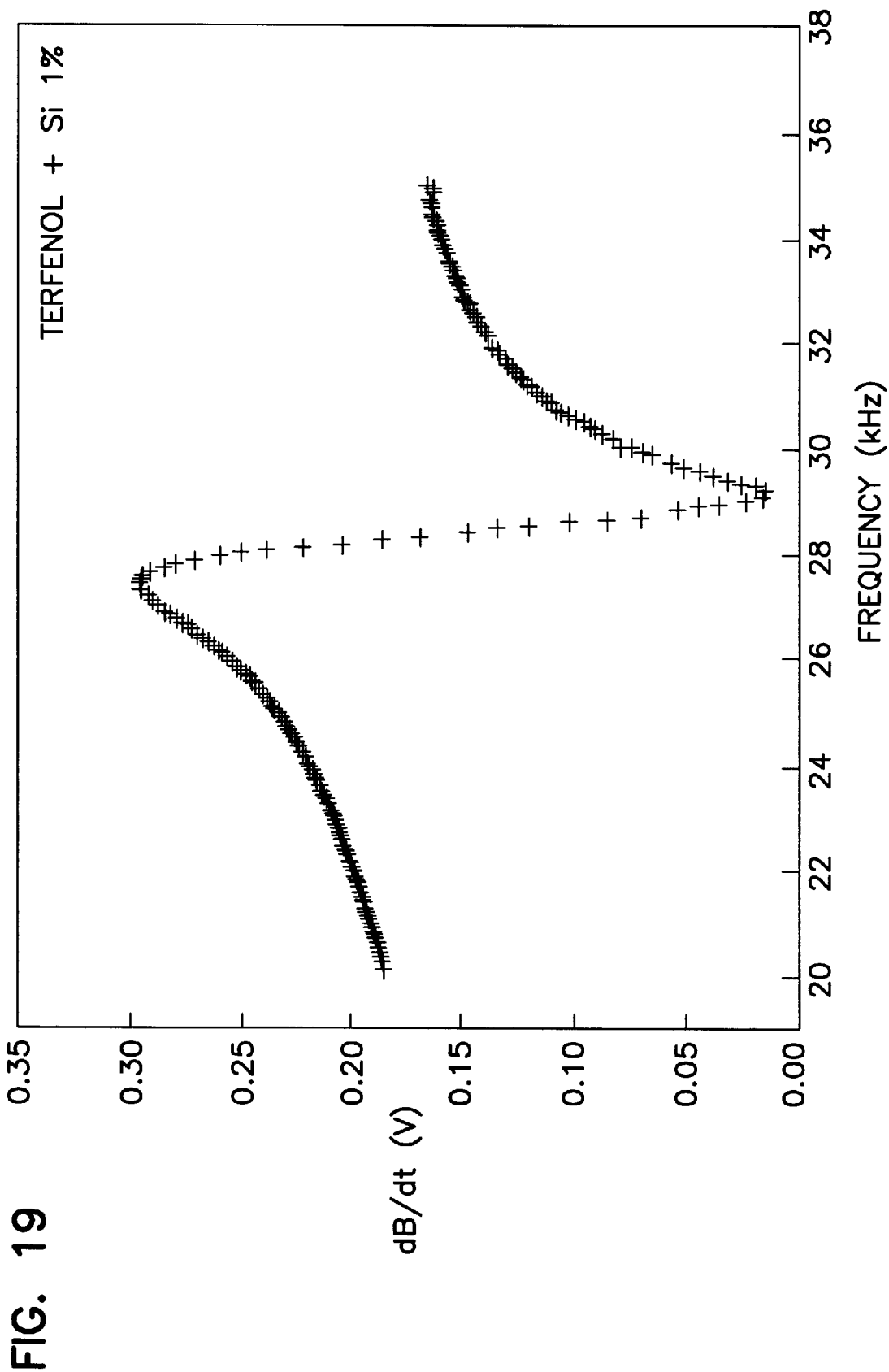

FIGS. 16–19 show resonance peaks for various Terfenol samples. Specifically, FIG. 16 is a plot of the resonance and antiresonance for polycrystalline Terfenol, FIG. 17 is a plot of the resonance and antiresonance for the polycrystalline Terfenol sample doped with 1% Al, and FIGS. 18 and 19 are different plots of the resonance and antiresonance for the same polycrystalline sample of Terfenol doped with 1% Si. Specifically, FIG. 18 was obtained by the inventors using the equipment and system noted in Application on pages 100–105. FIG. 19 was obtained by the coauthors of Pulverenti (R. D. Greenbough and I. M. Reed) using equipment in England, and is noted as FIG. 2 in Pulverenti. The differences between FIGS. 18 and 19 illustrate the fact that $f_r$ and $f_a$ are system-dependent. That is, different measurement techniques or different equipment can yield different $f_r$ and $f_a$ for the same sample, since the k coefficient is not considered a measure of the individual sample, but of the entire system.

Examples of the differences in k using the two different equations noted above, i.e., the "resonance" method (k1) and the "three parameter" (k2) method are shown in Table 1.

TABLE 1

Magnetomechanical coupling coefficients calculated from resonance method (k1) and from three-parameter method (k2) for various samples

| SAMPLE | k1 | k2 |
|---|---|---|
| polycrystalline Terfenol | .324 | .232 |
| Terfenol + 1% Al | .389 | .287 |
| Terfenol + 1% Si | .391 | .290 |

Results

Figure 20:
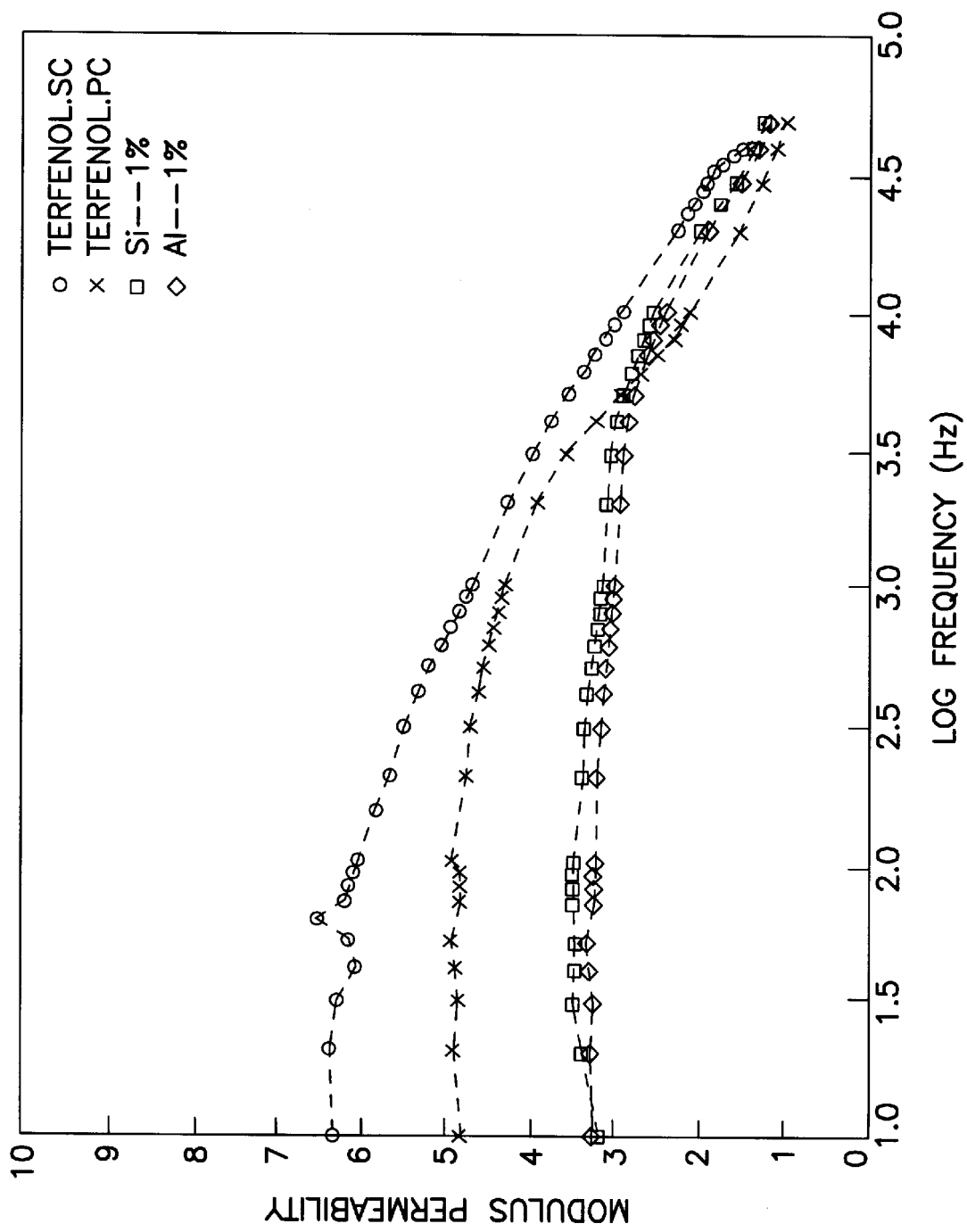
FIG. 20 is a plot of the modulus permeability for a single crystal Terfenol, an undoped polycrystalline Terfenol, a polycrystalline Terfenol with one (1)% Si added, and a polycrystalline Terfenol with one (1)% Al added in one embodiment of the present invention.
Figure 21:
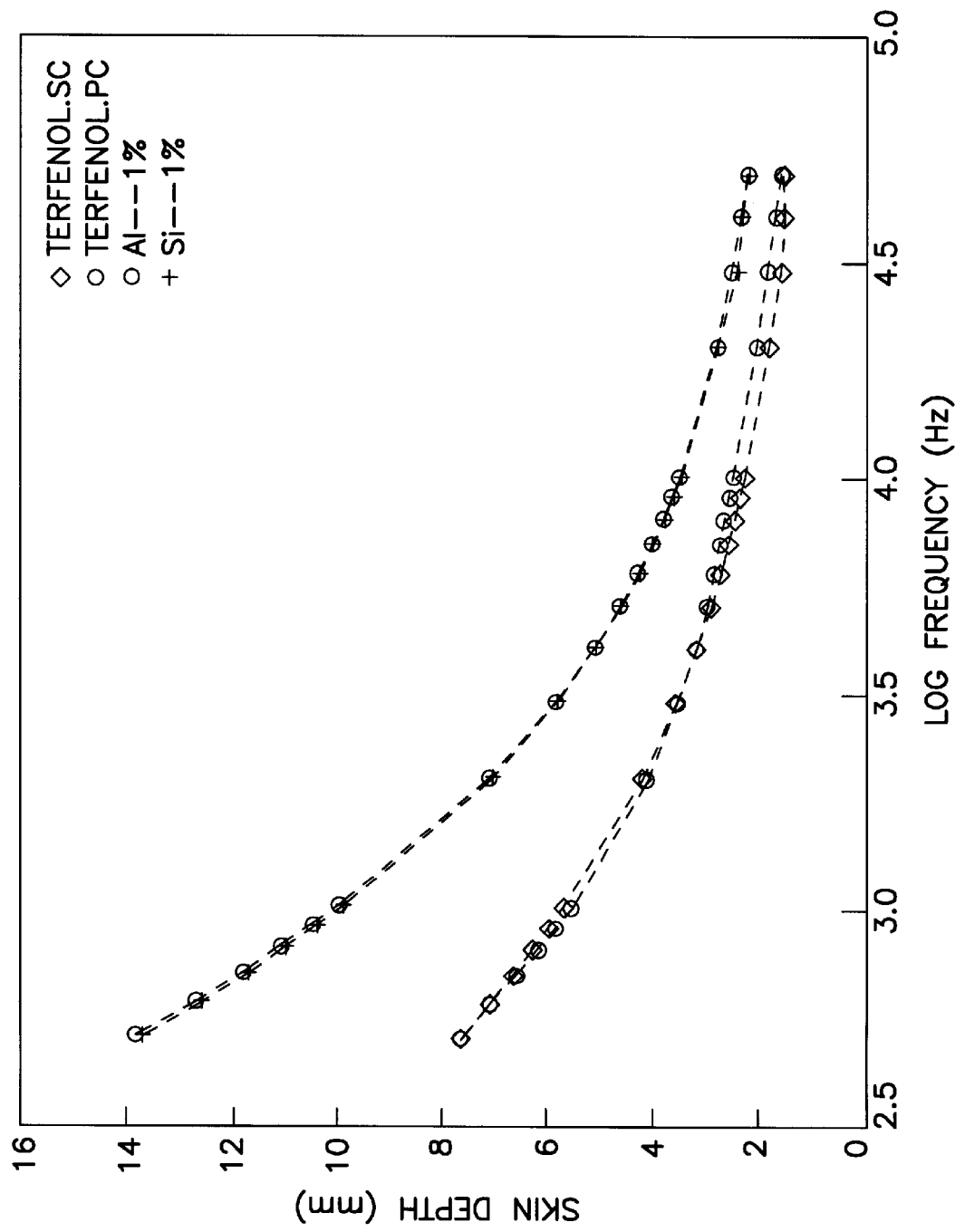
FIG. 21 is a plot of the calculated skin depth versus log frequency for a single crystal Terfenol, an undoped polycrystalline Terfenol, a polycrystalline Terfenol with one (1)% Si added, and polycrystalline Terfenol with one (1)% Al added.

FIG. 20 shows the complex permeability as a function of frequency for a single crystal sample of Terfenol (see also FIG. 7), a polycrystalline sample (see also FIG. 8), and two polycrystalline samples doped with either 1% Al or Si. As FIG. 20 shows, the permeability is initially lower in the polycrystalline samples, but remains relatively constant for a wider frequency range than for the single crystal sample. However, it can be seen that the two doped samples show enhanced properties at higher frequency. In fact, at 5 kHz and above, the permeability of the doped Terfenol samples is greater than the undoped polycrystalline sample. Furthermore, the permeability of the Terfenol and Si alloy is not only higher initially, it remains at a higher level even at greater frequencies as compared with the undoped single or polycrystalline Terfenol samples.

Normal skin depth was also calculated for all samples using the equation noted in Application, namely:

$$\delta = \sqrt{\frac{\rho}{\lambda \mu f}}$$

where $\rho$ is the resistivity (inverse of conductivity $\sigma$), $\mu$ is the permeability, and f is the frequency. The samples with 1% each of Al or Si exhibited a 125% increase in resistivity compared to the pure Terfenol sample and a 50% increase in magnetic field penetration at 1 kHz. This corresponded to an increase in skin depth of 80% at (one) 1 kHz. FIG. 20 shows the skin depth for the Terfenol samples versus frequency.

Specifically the polycrystalline unalloyed Tb-De-Fe material had $d=1.37 \times 10^{-1}$ m/A, $g=0.756 \times 10^{-3}$ As$^2$/kg, and k=0.23. An addition of 1% Al increased d to $1.89 \times 10^{-3}$ m/A and increased k to 0.287. An addition of 1% Si increased d to $1.92 \times 10^{-9}$ rm/A and increased k to 0.290. The addition of higher concentrations of either Al or Si resulted in specimens which were extremely brittle and which therefore may not have practical applications unless an alternate method of combining these materials can be found, such as alternating layers of Terfenol and a material of lower conductivity such as Si.

Notice the relative increase of skin depth of the doped samples compared with both undoped samples over the entire frequency range. Table 2 lists the magnetomechanical coupling coefficients, k2, for the polycrystalline samples as calculated using the three parameter method. The last column shows the increase in energy conversion efficiency $(\Delta k)^2$ exhibited by the doped samples. These results show that alloying additions of either 1% Al or Si leads to an increase of about 55% in energy conversion efficiency in the material. This improvement likely arises primarily because of the improved depth of penetration, i.e., skin depth, of the magnetic field in the material as noted above and as can be seen in FIG. 21.

As the data shows, the addition of Al or Si significantly improved the magnetoelastic properties of Terfenol material under ac conditions. In particular, the complex permeability showed an improvement at frequencies greater than 10 kHz. This demonstrates the possibility of producing doped Terfenol with an extended operating frequency range, and lower losses at these frequencies.

TABLE 2

Magnetomechanical coupling coefficients
and energy conversion efficiency for various samples

| SAMPLE | k2 | $(\Delta K)^2$ |
|---|---|---|
| polycrystalline Terfenol | .232 | — |
| Terfenol + 1% Al | .287 | 53% |
| Terfenol + 1% Si | .290 | 56% |

Conclusions

Although Terfenol has extraordinary static magnetostrictive properties ($\lambda$~2000 ppm) its principal use lies in dynamic applications, including adaptive vibration control. Because of the variation of properties from sample to sample, it has been necessary to characterize the material in terms of parameters such as magnetostriction $\lambda$, piezomagnetic strain coefficient d, complex permeability $\mu$, magnetomechanical coupling coefficient, k, and the magnetic Grüneisen parameter $\gamma_{me}$. These parameters can be used to characterize both static and dynamic performance of magnetostrictive materials and to compare from one sample to another. As mentioned above, one is generally more interested in the dynamic performance of Terfenol.

This being the case, it is necessary to optimize the performance of the material under the condition of a time-dependent magnetic field. The optimization condition requires the minimization of losses (such as those from the induced eddy currents). This is an important consideration since in practice it is necessary to extend the operational frequency range. One means by which this can be achieved is through the reduction of the conductivity.

The present invention provides methods by which to reduce the electrical conductivity of Tb-Dy-Fe alloys, thereby increasing the depth of penetration of ac magnetic fields and extending the operational frequency range. Specifically, polycrystalline samples of Terfenol were doped with either Si or Al. The impurity atom from the Si or Al increased scattering for the conduction electrons, thereby reducing electron mobility and increasing resistivity. The result is a material which enables increased mechanical efficiency to be achieved at higher frequencies simply by enabling the magnetic field to penetrate to a greater depth, thus activating a larger volume of material.

As shown above, the permeability of the doped samples remains constant over a wider frequency range as compared with the undoped Terfenol material, whose permeability decreased more rapidly as a function of frequency. Doped Terfenol shows an average increase in resistivity of 125%, resulting in an average increase in penetration depth of 80% at 1 kHz and in energy conversion efficiency of 55%. These results demonstrate that Si and Al additions are effective in improving the ac characteristics of a material such as Terfenol.

In connection with the dynamic characterization of magnetostrictive materials a preferred Grüneisen parameter, i.e., a "magnetoelastic" Grüneisen parameter $\gamma_{me}$, has also been derived from the thermodynamic equations of state. This magnetoelastic parameter is proportional to the anharmonic coefficient of the lattice potential $n_3$ and gives a measure of the anharmonicity of the material. It is also proportional to the magnetomechanical coupling coefficient, k. This therefore provides another means by which to characterize the coupling efficiency in magnetostrictive materials, on a more fundamental basis. The magnetoelastic parameter is dependent on the reciprocal of the applied magnetic field. Further, the field dependence of the energy conversion efficiency in the magnetostrictive materials can therefore be predicted using the magnetoelastic Grüneisen parameter.

Although this invention has been described in terms of several preferred embodiments, other embodiments are possible. For example, the novel method of the present invention can be applied to single crystal specimens of Terfenol. In addition to the reduction of conductivity already evidenced in the polycrystalline material, one might expect single crystal samples to possess a higher initial permeability with the addition of Group II or IV elements such as silicon, aluminum or boron.

In another embodiment, layered specimens consisting of alternate layers of Terfenol and a material of lower conductivity such as Si can be fabricated to improve the performance of Terfenol.

Source Code Listing

Set forth below is the algorithm used with the Eddy Current Factor program described herein. The Eddy Current Factor program is used for the purpose of determining losses in the eddy current factor for magnetostrictive materials during dynamic or ac conditions.

```
      program chi           paramter (nfreqd=1000)
         real*8 xr(nfreqd), yr(nfreqd), xi(nfreqd), yi(nfreqd)
         real*8 chir(nfreqd), chii(nfreqd)
   real*8 f(nfreqd), q(nfreqd), facto
c This program calculates the real and imaginary parts of
c the eddy current factor, chi.
         nfreq=101 ! number of points: frequency range
         nterms=10 ! number of terms calculated
         fc=50 ! critical frequency, changes for each sample
      do I=1, nfreq
      xr(I)=0
      xi(I)=0
      yr(I)=0
      yi(I)=0
      enddo
      do j=0. nterms ! loop over number of terms
         do I=1.nfreq ! loop over frequencies
         f(I)=9+exp(0.1082*(I-1))
         q(I)=f(I)/fc)
         xr(I)=xr(I)+(q(I)/4)**(2*j)/((facto(j))**2*(facto(2*j+1)))
         yr(I)=yr(I)+(q(I)/4)**(2*j)/((facto(j))**2*(facto(2*j)))
```

-continued

```
c         print *, yr(I)
      xi(I)=xi(I)+(2*j)*(q(I)/4)**(2*j)/((facto(j))**2*
      (facto(2*j)))
c         print *, xi(I)
yi(I)=yi(I)+(q(I)/4)**(2(j)/((facto(j))**2*(facto(2*j)))
c         print *, yi(I)
         enddo
      enddo
         do I=1.110
            chir(I)=xr(I)/yr(I)
            chii(I)=(2/q(I))*(xi(I)/yi(I))
            write(12,*) dlog10(f(I))
            write(13,*) chir(I)
            write(14,*) chii(I)
            print *, dlog10(f(I)), chir(I), chii(I)
         enddo
         end
         function facto(j)
         real*8 x, facto
         x=1
         do k=1.j
         x=x*k
         enddo
         facto=x
            end
```

What is claimed is:

1. A composition consisting essentially of a Laves phase compound having the general formula $Tb_xDy_{1-x}Fe_z$ and silicon, wherein the silicon is added to the Laves phase compound to produce an alloyed compound having the general formula:

$$(Tb_xDy_{1-x})(Fe_yT_{1-y})_z$$

wherein $0 \leq x \leq 1$;

$0 \leq y \leq 1$;

$1.5 \leq z \leq 2.1$; and

T is silicon in a concentration of up to one (1)% by weight, wherein addition of the silicon increases mechanical efficiency of the Laves phase compound.

2. A method of alloying a magnetostrictive material comprising adding Si in a concentration of up to one (1)% by weight to the magnetostrictive material, the magnetostrictive material being a Laves phase compound having the general formula $Tb_xDy_{1-x}Fe_z$ wherein $0 \leq x \leq 1$;

$0 \leq y \leq 1$; and $1.5 \leq z \leq 2.1$, further wherein ac characteristics of the material are improved.

3. A composition according to claim 1 prepared by a drop cast method.

4. A method according to claim 2 further comprising placing the magnetostrictive material in a magnetostrictive sensor or actuator wherein the magnetostrictive sensor or actuator has varying levels of magnetic field strength depending on the alloy level.

5. A composition according to claim 1 wherein the silicon is added in a concentration sufficient to increase penetration depth of the Laves phase compound by up to about 80%.

6. A method according to claim 2 wherein the silicon is added in a concentration sufficient to increase penetration depth of the magnetostrictive material by up to about 80%.

7. A composition according to claim 1 wherein a layer of silicon is added in between layers of the Laves phase compound.

8. A magnetically-charged composition consisting essentially of a Laves phase compound, the Laves phase compound having the general formula $Tb_xDy_{1-x}Fe_z$ and silicon, wherein the silicon is added to the Laves phase compound to produce an alloyed compound having the general formula:

$$(Tb_xDy_{1-x})(Fe_yT_{1-y})_z$$

wherein $0 \leq x \leq 1$;

$0 \leq y \leq 1$;

$1.5 \leq z \leq 2.1$; and

T is silicon in a concentration of up to one (1)% by weight, further wherein addition of the silicon increases penetration depth of an applied magnetic field into the laves phase compound.

9. A method according to claim 2 further comprising placing the material in an alternating magnetic field.

10. A method according to claim 9 wherein remanent magnetization exists in the material after the alternating magnetic field is removed.

* * * * *

UNITED STATES PATENT AND TRADEMARK OFFICE
CERTIFICATE OF CORRECTION

PATENT NO. : 6,273,965 B1
DATED : August 14, 2001
INVENTOR(S) : Pulvirenti et al.

It is certified that error appears in the above-identified patent and that said Letters Patent is hereby corrected as shown below:

Column 1,
Lines 5-6, delete "This application claims priority to Ser. No. 60/028,514 filed Oct. 18, 1996." and insert -- Cross-Reference to Related Application
 This application claims the benefit under 35 USC §199(e) of U.S. Provisional Application No. 60/028,514, filed on October 18, 1996, which is incorporated herein by reference. --, therefor.

Column 3,
Lines 58-59, delete "Terfenol referes to two pseudo-binary alloys with the compositions" and insert -- Terfenol-D refers to pseudo-binary alloys having varying levels of terbium and dyprosium, such as, for example, --, therefor.
Line 60, after "$Tb_{.27}Dy_{.73}Fe_2$" insert -- The term "Terfenol" is often used in the art as a generic term to refer to either Terfenol or Terfenol-D. These terms are also used interchangeably herein. However, it is well-known that "Terfenol" more accurately refers to a rare-earth iron alloy containing only terbium as the rare-earth metal, while "Terfenol-D" can also include dyprosium in the alloy. Furthermore, Terfenol-D is most accurately represented by the formula $Tb_xDy_{1-x}Fe_z$ where $0 \leq x \leq 1$ and $1.5 \leq z \leq 2.1$ --.

Column 4,
Line 7, after "earths." insert -- Aside from the earths alloyed with iron to make Terfenol (or Terfenol-D), iron can also be alloyed with other rare earth elements, including La, Ce, Pr, Nd, Sm, Gd, Tb, Dy, Er, Tm and Lu, or combinations thereof. Rare earth-iron alloys having the highest magnetostriction are cubic Laves phase compounds, which are represented by the formula, $R_iFe_2$, where $R_i$ is a rare earth metal or a combination of rare earth metals. A Laves phase compound crystallizes in the face-centered (fcc) Laves phase C15-type structure. Among these compounds, $TbFe_2$ and $SmFe_2$ are known to exhibit the largest room temperature magnetostriction. See also Table 4.2 on page Application which shows magnetostriction values for a number of $RFe_2$ compounds. --.

Column 9,
Line 57, after "III or IV element." insert -- ("Doping" refers to the addition of one or more elements to a compound. Although the term "doping" is used interchangeably herein with the term "alloying," it is well-known that alloying also encompasses substitutions of element.) --.

Column 10,
Line 1, after "undoped Terfenol." insert -- These percentages refer to "weight" percentage. In order to represent the resulting compounds by an atomic formula, however, it is possible to convert a weight percentage to an atomic fraction. For example, a sample of Terfenol-D containing one (1) weight percentage Al can be represented by the formula, $(Tb_{.3}Dy_{.7})(Fe_{.95}Al_{.05})_{1.92}$. --.

UNITED STATES PATENT AND TRADEMARK OFFICE
CERTIFICATE OF CORRECTION

PATENT NO. : 6,273,965 B1
DATED : August 14, 2001
INVENTOR(S) : Pulvirenti et al.

It is certified that error appears in the above-identified patent and that said Letters Patent is hereby corrected as shown below:

Column 10 (continued),
Lines 45-46, after "the same." insert the following paragraph -- As noted above, samples were prepared using the drop cast method. This method consist of preparing a metallic specimen having a uniform diameter, for use in property measurement studies. Specifically, the components of a given alloy are arc-melted into a homogenous "button" shape. This sample is then re-melted and cast into a water-cooled split copper mold having the desired diameter. The entire operation is carried out in a conventional nonconsumable electrode arc-melter. The melt chamber itself is back-filled with argon (Ar) gas. Methods of preparing magnetostrictive materials or magnetostrictive alloys for commercial use include, but are not limited to, the free standing zone melt method. --.

Column 12,
Lines 50-54, delete "$\delta = \sqrt{\dfrac{\rho}{\lambda \mu f}}$" and insert -- $\delta = \sqrt{\dfrac{\rho}{\pi \mu f}}$ --, therefor.

Line 63, delete "d=1.37×10$^{-1}$" and insert -- d=1.37×10$^{-9}$ --, therefor.
Line 66, delete "rm/A" and insert -- m/A --, therefor.

Column 14,
Line 35, delete "Group II" and insert -- Group III --, therefor.

Column 16,
Line 38, delete "laves" and insert -- Laves --, therefor.

Signed and Sealed this

Twenty-eighth Day of May, 2002

JAMES E. ROGAN
*Director of the United States Patent and Trademark Office*

*Attest:*

*Attesting Officer*